United States Patent [19]

Yamazaki

[11] Patent Number: 4,543,267
[45] Date of Patent: Sep. 24, 1985

[54] METHOD OF MAKING A NON-SINGLE-CRYSTALLINE SEMI-CONDUCTOR LAYER ON A SUBSTRATE

[76] Inventor: Shunpei Yamazaki, 21-21 Kitakarasuyama 7-chome, Setagaya-ku, Tokyo, Japan

[21] Appl. No.: 429,255

[22] Filed: Sep. 30, 1982

Related U.S. Application Data

[62] Division of Ser. No. 377,314, May 12, 1982, Pat. No. 4,492,716, which is a division of Ser. No. 177,889, Aug. 14, 1980, abandoned.

[30] Foreign Application Priority Data

Aug. 16, 1979 [JP] Japan ................................ 54-104452

[51] Int. Cl.⁴ .............................................. B05D 3/06
[52] U.S. Cl. ......................................... 427/39; 427/86
[58] Field of Search ........................ 427/38, 39, 45.1, 86

[56] References Cited

U.S. PATENT DOCUMENTS

| | | | |
|---|---|---|---|
| 3,472,679 | 10/1969 | Ing et al. | 427/38 |
| 3,961,103 | 6/1976 | Aisenberg | 427/39 |
| 4,015,558 | 4/1977 | Small et al. | 118/729 |
| 4,214,926 | 7/1980 | Katsuto et al. | 427/87 |
| 4,223,048 | 9/1980 | Engle | 427/39 |
| 4,232,057 | 11/1980 | Ray et al. | 427/39 |
| 4,250,832 | 2/1981 | Ozaki | 427/38 |
| 4,282,267 | 8/1981 | Kuyel | 427/45.1 |
| 4,282,268 | 8/1981 | Priestley et al. | 427/39 |
| 4,328,258 | 5/1982 | Coleman | 427/39 |

FOREIGN PATENT DOCUMENTS

2033355  5/1980  United Kingdom ................... 427/39

OTHER PUBLICATIONS

Barber, "IBM Tech. Disc. Bull.", vol. 11, No. 7, 12-1968, pp. 757, 758.

Broosky et al., "IBM Tech. Disc. Bull.", vol. 22, No. 8A, 1-1980, pp. 3391, 3392.

*Primary Examiner*—John H. Newsome
*Attorney, Agent, or Firm*—Murray, Whisenhunt & Ferguson

[57] ABSTRACT

A multi-layer semiconductor manufacturing method which employs a plurality of sequentially arranged, adjacent reaction chambers and a plurality of normally closed shutter means respectively separating the reaction chambers. The reaction chambers are each provided with a gas inlet and gas outlet where the reaction chambers each have positioned therein a substrate. The method includes (a) respectively depositing semiconductor layers on the substrates by respectively introducing semiconductor compound gases into the reaction chambers through the gas inlets thereof in such a state that the gases in the reaction chambers are exhausted therefrom through the gas outlets thereof and by respectively applying ionizing electromagnetic fields to the semiconductor compound gases to ionize them into semiconductor compound gas plasmas while at the same time respectively passing semiconductor gas plasmas into the reaction chambers by discharging therefrom the gases, (b) displacing the shutter means and respectively moving the substrates to the next adjacent reaction chambers while removing the substrate in the last chamber, which may be a taking out chamber, while at the same time evacuating entirely the first chamber which may be an insertion chamber, and the remaining reaction chambers or passing therethrough only carrier gases and then closing the shutter means, and (c) positioning a substrate in the first or insertion chamber while at the same time taking out substrate from the last or taking-out chamber to thereby fabricate the multi-layer semiconductor having a plurality of sequentially laminated semiconductor layers.

6 Claims, 3 Drawing Figures

METHOD OF MAKING A NON-SINGLE-CRYSTALLINE SEMI-CONDUCTOR LAYER ON A SUBSTRATE

REFERENCE TO RELATED APPLICATIONS

This application is a divisional of U.S. Ser. No. 377,314 filed May 12, 1982 (now U.S. Pat. No. 4,492,716), which, in turn, is a divisional of U.S. Ser. No. 177,889 filed Aug. 14, 1980 (now abandoned).

BACKGROUND OF THE INVENTION

1. Field of the Invention

This invention relates to a method of making a non-single-crystalline semiconductor layer on a substrate, and more particularly to a non-single-crystalline semiconductor layer manufacturing method which is of particular utility when employed in the fabricatian of a semiconductor photoelectric conversion device which may be used as a solar battery.

2. Description of the Prior Art

A semiconductor photoelectric conversion device using a non-single-crystalline semiconductor layer composed of amorphous or semi-amorphous semiconductor layers has now been taken notice of because the non-single-crystalline semiconductor layer may be formed thin, that is, the semiconductor material needed is small in amount and because the photoelectric conversion efficiency can be enhanced, as compared with a semiconductor photoelectric conversion device employing a single crystal or polycrystalline semiconductor.

The following method has heretofore been proposed for forming a non-single-crystalline semiconductor layer on a substrate.

The substrate is disposed in a reaction chamber having a gas inlet and a gas outlet, and a mixture gas including at least a semiconductor material gas and a carrier gas is introduced into the reaction chamber in such a state that a gas in the reaction chamber is exhausted through the gas outlet. An electromagnetic field is applied to the mixture gas to ionize it into a plasma, thereby to deposit a semiconductor material on the substrate. In this case, the atmospheric pressure in the reaction chamber is held below 1 atm and the substrate is maintained at a temperature lower than that at which the semiconductor material deposited on the substrate is formed as a crystalline semiconductor layer, thereby to obtain a desired non-single-crystalline semiconductor layer on the substrate.

With the conventional method, the substrate is usually disposed in that region of the reaction chamber in which the mixture gas plasma is produced. In this case, however, it is very difficult to form the mixture gas plasma homogeneously over the entire surface of the substrate in the reaction chamber because of the plasma forming mechanism.

Accordingly, the prior art method is defective in that the non-single-crystalline semiconductor layer formed on the substrate has many voids and is unhomogeneous in the direction of the plane of the semiconductor layer. Further, even if non-single-crystalline semiconductor layers are formed concurrently and individually on a number of substrates placed in the reaction chamber, the non-single-crystalline semiconductor layers are inevitably subject to dispersion in property; consequently, the conventional method is incapable of mass production of non-single-crystalline semiconductor layers of good quality.

Moreover, in the conventional method, the electromagnetic field for ionizing the mixture gas into a plasma is usually a DC electromagnetic field or a low-frequency electromagnetic field, so that the ratio in which the mixture gas is ionized into the plasma is very low, for example, below 1%.

Therefore, relatively much time is needed for forming a non-single-crystalline semiconductor layer to a required thickness on the substrate. Further, the mixture gas which is not ionized into a plasma is discharged without being used; this is a waste of the mixture gas. In general, a semiconductor hydride or halide gas is used as the semiconductor material gas in the mixture gas. For example, in the case of forming a non-single-crystalline semiconductor layer of silicon on the substrate, an $SiH_4$ (silane) gas is used as the above said semiconductor material gas. Such $SiH_4$ gas is ionized into a plasma of silicon and a plasma of hydrogen. According to the prior art method, since the electric field for ionizing the mixture is a DC or low-frequency electric field, the plasma of hydrogen is small in mass and hence is relatively small in kinetic energy. On the other hand, the plasma of silicon is large in mass and hence is relatively large in kinetic energy. The fact. that the kinetic energy of the plasma of silicon is large means that damage is imposed on a non-single-crystalline semiconductor Si layer in the course of its formation on the substrate while depositing thereon silicon. Further, the fact that the kinetic energy of the plasma of hydrogen is small means that it does not easily enter into the layer; therefore the effect of neutralizing dangling bonds in the layer is not sufficient.

Accordingly, the conventional method is incapable of making of non-single-crystalline, semiconductor layer of good quality.

SUMMARY OF THE INVENTION

Accordingly, it is an object of the present invention to provide a novel non-single-crystalline semiconductor layer manufacturing method which is free from the above-said defects of the prior art.

The method of making the non-single-crystalline semiconductor layer of the present invention employs a reaction chamber provided with a gas inlet and a gas outlet.

According to an aspect of the present invention, a substrate is disposed in the reaction chamber, and a mixture gas containing at least a semiconductor material gas is introduced into the reaction chamber through the gas inlet thereof in such a state in which the gas in the reaction chamber is exhausted therefrom through the gas outlet. In. this case, in the reaction chamber, an ionizing, high-frequency electromagnetic field of 1 GHz or more is applied to the mixture gas to ionize into a mixture gas plasma and the mixture gas plasma is passed into the reaction chamber by discharging the gas in the reaction chamber and, in the reaction chamber, a semiconductor material is deposited on the substrate as a result of the flowing of the mixture gas plasma into the reaction chamber, and in this case, the atmospheric pressure in the reaction chamber is held below 1 atm and the temperature of the substrate is maintained lower than that of single-crystallizing the semiconductor material deposited on the substrate, thereby to form a non-single-crystalline semiconductor layer on the substrate.

In accordance with the method of the present invention, the mixture gas plasma is formed in the reaction chamber and then passed through the reaction chamber. Therefore, in the reaction chamber the mixture gas plasma is substantially homogeneous throughout it. And the substrate is placed in the reaction chamber filled with such a substantially homogeneous mixture gas plasma is provided.

Accordingly, the method of the present invention has the advantage that the non-single-crystalline semiconductor layer deposited on the substrate can be obtained as a non-single-crystalline semiconductor layer which has substantially no or a negligibly small number of voids and is homogeneous in the direction of its plane. Moreover, even if non-single-crystalline semiconductor layers are formed concurrently and individually on a number of substrates placed in the reaction chamber, no dispersion is introduced in their property; accordingly, this provides the advantage that non-single-crystalline semiconductor layers of good quality can be mass-produced.

Moreover, since the method of the present invention employs a high-frequency electromagnetic field for ionizing the mixture gas into the mixture gas plasma, the ratio of ionizing the mixture gas into the mixture gas plasma is far higher than in the case of the priorart method. The ratio is, for example above 20%.

Accordingly, the non-single-crystalline semiconductor layer of a required thickness can be formed in a short time and the mixture gas can be used efficiently. Moreover, according to the method of this invention, a semiconductor hydride gas may be used as the semiconductor material gas in the mixture gas. Such a semiconductor gas is ionized into a plasma of semiconductors and a plasma of hydrogen. In this case, since the electric field for ionizing the mixture gas is the high-frequency electric field above 1 GHz, the plasma of hydrogen is small in mass and hence is relatively large in kinetic energy. On the other hand, the plasma of semiconductors are large in mass and hence is relatively small in kinetic enregy. The fact that the kinetic energy of the plasma of semiconductors are small means that no damage is imposed on a non-single-crystalline semiconductor layer in the course of its formation on the substrate while depositing thereon semiconductor. Further, the fact that the kinetic energy of the plasma of hydrogen is large means that it easily enters into the layer to neutralize dangling bonds therein. Since the mass of the plasma of hydrogen is light, no damage is imposed on the layer. Accordingly, the layer is formed with good quality.

Accordingly, the method of the present invention is advantageous in that the resulting non-single-crystalline semiconductor layer is free from voids and homogeneous in the direction of its surface.

Furthermore, the method of the present invention exhibits the advantage that a homogeneous, non-crystalline semiconductor layer can easily be obtained.

Other objects, features and advantages will become more apparent from the following description taken in conjunction with the accompanying drawings.

DESCRIPTION OF THE PREFERRED EMBODIMENTS

Figure 1:
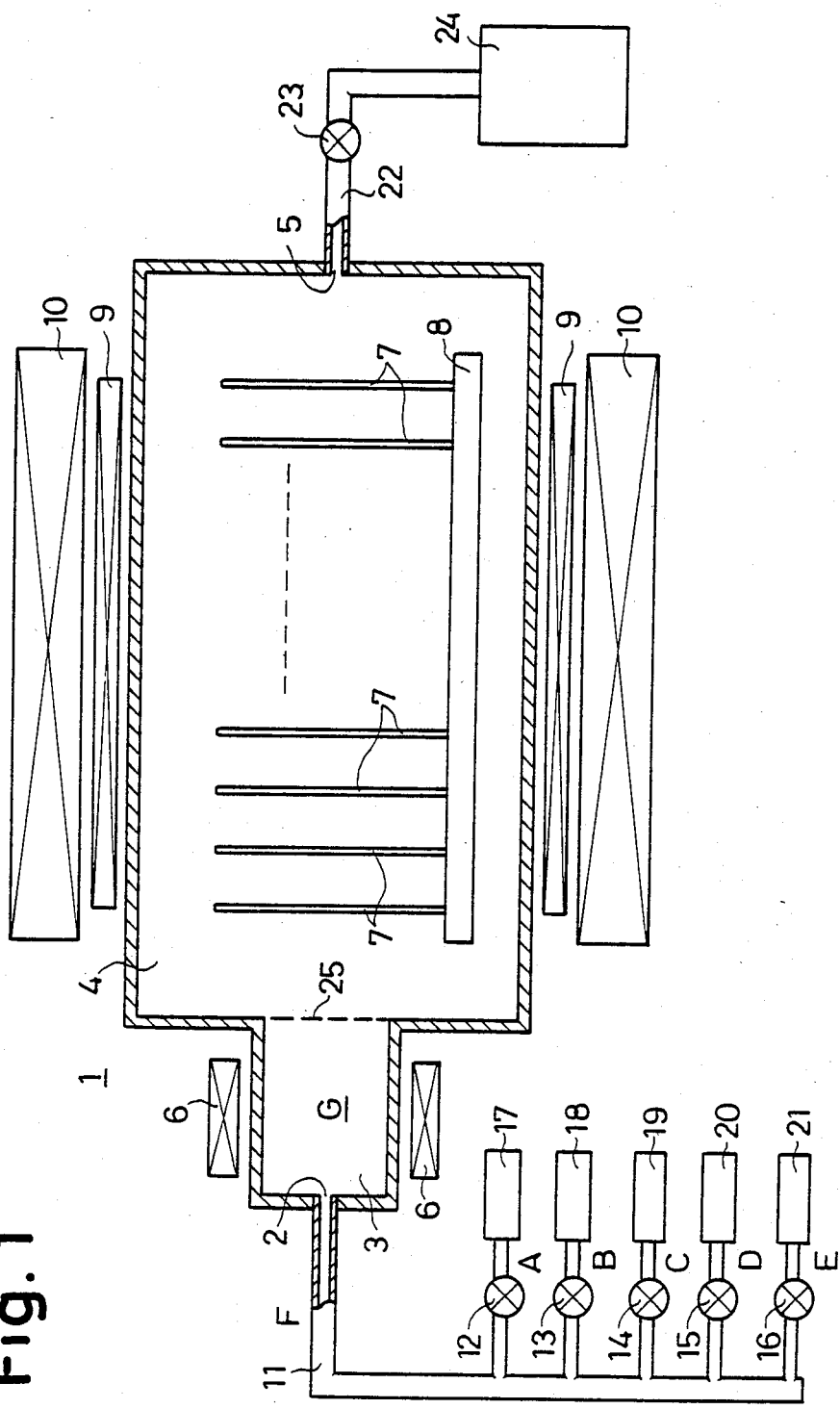
FIG. 1 is a schematic diagram illustrating an embodiment of the non-single-crystalline semiconductor manufacturing method of the present invention and an example of the arrangement used therefore.

FIG. 1 illustrates an embodiment of the non-single-crystalline semiconductor layer manufacturing method of the present invention and an arrangement therefore, in which a reaction chamber 1 is employed.

The reaction chamber 1 has a gas inlet 2, a gas ionizing region 3, a semiconductor depositing region 4, and a gas outlet 5 which are provided in this order. The gas ionizing region 3 has a smaller effective cross-section than the semiconductor depositing region 4. Arranged around the gas ionizing region 3 is an ionizing high-frequency power source 6 which applies to the gas ionizing region 3 an ionizing high-frequency electromagnetic field of, for example, as 1 to 10 GHz, preferably 2.46 GHz. The high-frequency power source 6 may be formed by a microwave guide tube which is supplied with a high-frequency power, i.e. micro-wave power.

Disposed around the semiconductor depositing region 4 of the reaction chamber 1 is an orientating-accelerating high-frequency power source 9 which applies to the semiconductor depositing region 4 an orientating-accelerating electric field perpendicularly to the surfaces of the substrates 7. The electric field has a relatively low alternating frequency, for example, 1 to 100 MHz, preferably 13.6 MHz. The high-frequency power source 9 may be formed by a coil which is supplied with a high-frequency current. The high-frequency power source 9 is covered with a heating source 10 which heats the semiconductor depositing region 4 and consequently the substrates 7. The heating source 10 may be a heater which is supplied with a direct current.

To the gas inlet 2 of the reaction chamber 1 is connected one end of a mixture gas supply pipe 11, to which are connected a main semiconductor material compound gas source 17, an N type impurity compound gas source 18, a P type impurity compound gas source 19, an additional semiconductor material compound gas source 20 and a carrier gas source through control valves 12, 13, 14, 15 and 16, respectively. From the main semiconductor material compound gas source 17 is supplied a main-semiconductor material compound gas A such as a main semiconductor material hydride gas, a main semiconductor material halide gas, a main semiconductor material organic compound gas or the like. The main semiconductor material gas A is, for example, a silane ($SiH_4$) gas, a dichlorosilane ($SiH_2Cl_2$) gas, a trichlorosilane ($SiHCl_3$) gas, silicon tetrachloride ($SiCl_4$) gas, a silicon tetrafluoride ($SiF_4$) gas or the like. From the N type impurity compound gas source 18 is supplied an N type impurity compound gas B such as an N type impurity hydride gas, an N type impurity halide gas, N type impurity hydroxide gas or the like, for example, a hydride, halide or hydroxide gas of nitrogen, phosphorus, arsenic, antimony, tellurium, or the like. The N type impurity compound gas B is, for example, a phosphine ($PH_3$) gas, an arsine ($AsH_3$) gas or the like. From the P type impurity compound gas source 19 is supplied a P type impurity compound gas C such as a P type impurity hydride gas, a P type impurity hydroxide gas, a P type impurity halide gas or the like. The P type impurity compound gas C is, for example, a hydride, hydroxide or halide gas of boron, aluminum, gallium, indium or the like. For instance, a diborane ($B_2H_6$) gas is supplied from the P type impurity compound gas source 19. From the additional semiconductor material compound gas source 20 is supplied an additional semiconductor material compound gas D such as an additional semiconductor material hydroxide or halide gas of nitrogen, germanium, carbon, tin, lead or the like, for example, an $SnCl_2$, $SnCl_4$, $Sn(OH)_2$, $Sn(OH)_4$, $PbCl_2$, $PbCl_4$, $Pb(OH)_2$, $Pb(OH)_4$ or like gas. From the carrier gas source 21 is supplied a carrier gas E which is a gas composed of or contains a helium (He) and/or neon (Ne) gas, for example, a gas composed of the helium gas, a neon gas, or mixture gas of the helium gas or the neon gas and a hydrogen gas.

To the gas outlet 5 of the reaction chamber 1 is connected one end of a gas outlet pipe 22, which is connected at the other end to an exhauster 24 through a control valve 23. The exhauster 24 may be a vacuum pump which evacuates the gas in the reaction chamber 1 through the control valve 23 and the gas outlet tube 22.

It is preferred that a gas homogenizer 25 is provided midway between the gas ionizing region 3 and the semiconductor depositing region 4 in the reaction chamber 1.

In the semiconductor depositing region 4 of the reaction chamber 1 there are placed a plurality of parallel substrates 7 planted on a boat 8 as of quartz.

The substrates 7 may be conductive metal substrates as of stainless steel, titanium, titanium nitride or the like; semiconductor substrates as of silicon, silicon oxide, germanium or the like; insulating substrates as of alumina, glass, epoxy resin, polyimido resin or the like; substrates, each having a tin oxide, indium oxide, titanium oxide or like light transparent, conductive oxide layer formed on an insulating base plate; substrates, each having a conductive metal layer formed on an insulating base plate; or substrates, each having an N or P type semiconductor layer in a single or multi-layer form on an insulating base plate.

As described above, the substrates 7 are placed in the semiconductor depositing region 4 of the reaction chamber 1 and, in the state in which the gas in the reaction chamber 1 is exhausted by the exhauster 24 through the gas outlet 5, the gas outlet pipe 22 and the control valve 23, a mixture gas F containing at least the main semiconductor material compound gas A available from the main semiconductor material compound gas source 17 via the control valve 12 and the carrier gas F available from the carrier gas source 21 via the control valve 16 is introduced into the gas ionizing region of the reaction chamber 1 via the gas inlet 2. In this case, the mixture gas F may contain the N type impurity compound gas B available from the N type impurity compound gas source 18 via the control valve 13 or the P type impurity compound gas C available from the P type impurity compound gas source 19 via the control valve 14. Further, the mixture gas F may also contain the additional semiconductor material compound gas available from the additional semiconductor material compound gas source 20 via the control valve 15. The amount of the carrier gas E contained in the mixture gas F may be 5 to 99 flow rate %, in particular, 40 to 90 flow rate % relative to the mixture gas F.

A high-frequency electromagnetic field is applied by the ionizing, high-frequency power source 6 to the mixture gas F introduced into the gas ionizing region 3, by which the mixture gas F is ionized into a plasma, thus forming a mixture gas plasma G in the gas ionizing region 3. In this case, the high-frequency electromagnetic field may be one that has a 10 to 300 W highfequency energy having a frequency of 1 to 100 GHz, for example, 2.46 GHz.

Since the electromagnetic field employed for ionizing the mixture gas F into the mixture gas plasma G in the gas ionizing region 3 is a micro-wave electromagnetic field and has such a high frequency as mentioned above, the ratio of ionizing the mixture gas F into the mixture gas plasma G is high. The mixture gas plasma G contains at least a carrier gas plasma into which the carrier gas contained in the mixture gas F is ionized and a main semiconductor material compound gas plasma into which the semiconductor compound gas is ionized. Since the carrier gas contained in the mixture gas F is a gas composed of or containing the helium gas and/or the neon gas, it has a high ionizing energy. For example, the helium gas has an ionizing energy of 24.57 eV and the neon gas an ionizing energy of 21.59 eV. In contrast thereto, hydrogen and argon employed as the carrier gas in the conventional method have an ionizing energy of only 10 to 15 eV. consequently, the carrier gas plasma contained in the mixture gas plasma has a large energy. Therefore, the carrier gas plasma promotes the ionization of the semiconductor material compound gas contained in the mixture gas F. Accordingly, the ratio of ionizing the semiconductor material compound gas contained in the mixture gas into the semiconductor material compound gas plasma is high.

Consequently, the flow rate of the semiconductor material compound gas plasma contained in the mixture gas plasma G formed in the gas ionizing region 3 is high relative to the flow rate of the entire gas in the gas ionizing region 3.

The same is true of the case where the additional semiconductor material compound gas D, the N type impurity compound gas B or P type impurity compound gas C is contained in the mixture gas F and ionized into its gas plasma.

The mixture gas plasma G thus formed is flowed into the semiconductor depositing region 4 through the gas homogenizer 25 by exhausting the gas in the reaction chamber 1 by means of the exhauster 24 through the gas outlet 5, the gas outlet pipe 22 and the control valve 23.

By flowing the mixture gas plasma G into the semiconductor depositing region 4, a semiconductor material is deposited on the substrates 7 placed in the semiconductor depositing region 4. In this case, the flow rate of the mixture gas F introduced into the reaction chamber 1, especially the flow rate of the carrier gas E contained in the mixture gas F is controlled beforehand by the adjustment of the control valve 16 and the flow rate of the gas exhausted from the reaction chamber 1 through the gas outlet 5 is controlled in advance by adjustment of the control valve 23, by which the atmospheric pressure in the reaction chamber 1 is held below 1 atm. Moreover, the substrates 7 are maintained at a relatively low temperature under a temperature at which semiconductor layers deposited on the substrates become crystallized, for example, in the range from the room temperature to 700° C. In the case of maintaining the substrates at room temperature, the heating source 10 need not be used, but in the case of holding the substrate at a temperature higher than the room temperature, the heating source 10 is used to heat the substrates 7. Furthermore, the deposition of the semiconductor material on the substrates 7 is promoted by the orientating-accelerating electric field established by the orientating-accelerating high-frequency source 9 in a direction perpendicular to the surfaces of the substrates 7.

As described above, by depositing the semiconductor material on the substrates 7 in the semiconductor depositing region 4 in the state in which the atmospheric pressure in the reaction chamber 1 is held low and the substrates 7 are held at a relatively low temperature, desired non-single crystalline semiconductor layers are formed on the substrates 7.

In this case, the mixture gas plasma in the semiconductor depositing region 4 is the mixture plasma having flowed thereinto from the gas ionizing region 3, and hence is substantially homogeneous in the semiconductor depositing region 4. Consequently, the mixture gas plasma is substantially homogeneous over the entire surface of each substrate 7.

Accordingly, it is possible to obtain on each substrate 7 a non-single-crystalline semiconductor layer which is homogeneous in the direction of its surface and has substantially no or a negligibly small number of voids. Moreover, even if non-single-crystalline semiconductor layers are individually formed on a number of substrates 7 concurrently as shown, the non-single-crystalline semiconductor layers can be made without dispersion in their property; accordingly, non-single-crystalline semiconductor layers of good quality can be mass produced.

In addition, since the flow rate of the semiconductor material compound gas plasma contained in the mixture gas plasma G formed in the gas ionizing region 3 is large with respect to the flow rate of the entire gas in the gas ionizing region 3, as mentioned previously, the flow rate of the semiconductor material compound gas plasma contained in the mixture gas on the surface of each substrate 7 in the semiconductor depositing region 4 is also large relative to the flow rate of the entire gas on the surface of the substrate 7. This ensures that the non-single-crystalline semiconductor regions deposited on the surface of the semiconductor 7 has substantially no or a negligibly small number of voids and is homogeneous in the direction of the surface of the substrate 7.

Besides, since the carrier gas plasma contained in the mixture gas plasma formed in the gas ionizing region 3 has a large ionizing energy, as referred to previously, the energy of the carrier gas plasma has a large value when and after the mixture gas plasma flows into the semiconductor depositing region 4, and consequently the energy of the semiconductor material compound gas plasma contained in the mixture gas plasma on the substrate 7 in the semiconductor depositing region 4 has a large value. Accordingly, the non-single-crystalline semiconductor layer can be deposited on the substrate 7 with high density.

Furthermore, the carrier gas plasma contained in the mixture gas plasma is composed of or includes the helium gas plasma and/or the neon gas plasma, and hence has a high thermal conductivity. Incidentally, the helium gas plasma has a thermal conductivity of 0.123 Kcal/mhr° C. and the neon gas plasma 0.0398 Kcal/mhr° C. Accordingly, the carrier gas plasma greatly contributes to the provision of a uniform temperature distribution over the entire surface of the substrate 7. As a consequence, the non-single-crystalline semiconductor layer deposited on the substrate 7 can be made homogeneous in the direction of its surface.

Moreover, since the carrier gas plasma contained in the mixture gas in the semiconductor depositing region 4 is a gas plasma composed of or containing the helium gas plasma and/or the neon gas plasma, the helium gas plasma is free to move in the non-single-crystalline semiconductor layer formed on the substrate 7. This reduces the density of recombination centers which tends to be formed in the non-single-crystalline semiconductor layer, ensuring to enhance its property.

In accordance with the above embodiment of the present invention, it is possible to form on the substrate 7 a non-single crystalline semiconductor layer which has substantially no voids or, if any, a negligibly small number of voids and is homogeneous in the direction of its surface. That is, for example, a non-single-crystalline silicon layer can be formed on the substrate; further, an N type, non-single-crystalline silicon layer can also be formed which contains an N type, impurity as of nitrogen, phosphorus, arsenic, antimony or tellurium may also be formed; moreover, a P type, non-single-crystalline silicon layer can also be formed which contains a P type impurity as of boron, aluminum, gallium or indium; furthermore, a non-single-crystalline compound semiconductor layer can also be formed which is composed of, for example, silicon and nitrogen, germanium, carbon, tin or lead; in addition, a non-single-crystalline compound semiconductor layer can also be formed which is composed of, for example, $Si_3N_{4-x}(0>x>4)$, $Si_xGe_{1-x}(0>x>1)$, $Si_xC_{1-x}$, $(0>x>1)$, $Si_xSn_{1-x}(0>x>1)$ or $Si_xPb_{1-x}(0>x>1)$; besides, an N or P type, non-single-crystalline compound semiconductor layer can also be formed in which the above-said non-single-crystalline compound semiconductor layer contains the abovesaid N or P type impurity. It is also possible to form a non-single-crystalline compound semiconductor layer whose composition ration continuously varies in its thickwise direction. Furthermore, it is also possible to form a non-single-crystalline semiconductor layer whose composition ratio continuously varies from the composition ratio of a silicon layer to that of a non-single-crystalline compound semiconductor layers. Also it is possible to form a non-single-crystalline semiconductor layer which has formed therein one or more PN or hetero junctions.

According to the method of the present invention described above, the non-single-crystalline semiconductor layer is formed in the presence of the helium gas plasma and/or the neon gas plasma, and hence is annealed. If necessary, however, the non-single-crystalline semiconductor layer thus annealed may also be further annealed, using the helium gas plasma and/or neon gas plasma alone.

Figure 2:
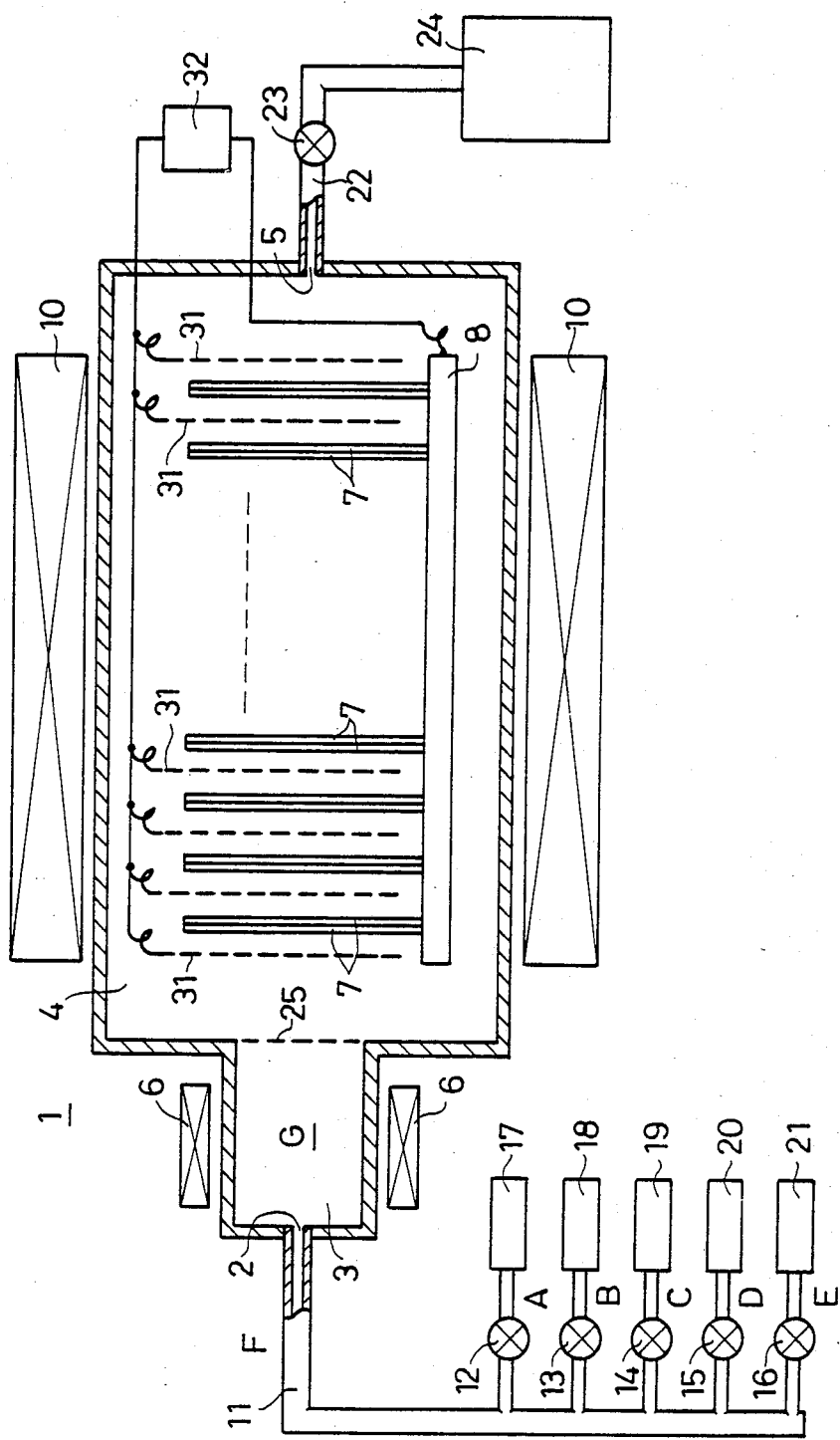
FIG. 2 is a schematic diagram showing another embodiment of the present invention and an example of the arrangement therefore.

Next, another embodiment of the non-single-crystalline semiconductor layer manufacturing method of the present invention will be described with reference to FIG. 2 which illustrates an example of the apparatus for use in this embodiment. In FIG. 2, parts corresponding to those in FIG. 1 are identified by the same reference numerals. The illustrated apparatus, though not described in detail, is identical in construction with the apparatus of FIG. 1 except in that the orientating-accelerating high-frequency source 9 disposed around the semiconductor depositing region 4 is omitted, in that a plurality of pairs of substrates 7 assembled together facing in opposite directions are disposed in parallel in the semiconductor depositing region 4 of the reaction chamber 1, in that a mesh-, grid- or blind- like electrode 31 is disposed between adjacent pairs of substrates 7 in parallel therewith, and in that an orientating-accelerating DC power source 32 is connected between the electrodes 31 and the pairs of substrates 7 via the boat 8 to set up an orientating-accelerating DC electric field perpendicular to the surface of each substrate 7. In this case, the boat 8 and each pair of substrates 7 are conductive or provided with a conductive layer so that they may be electrically connected with the orientating-accelerating DC power source 32.

In exactly the same manner as described previously in conjunction with FIG. 1, the mixture gas F containing at least the semiconductor material compound gas A and the carrier gas E is introduced via the gas inlet 2 into the gas ionizing region 3 of the reaciton chamber 1 while exhausting the gas in the reaction chamber 1.

The high-frequency electromagnetic field set up by the high-frequency power source 6 is applied to the mixture gas F to ionize it into a plasma, as described previously in connection with FIG. 1. As a result of this, the mixture gas plasma G is formed in the gas ionizing region 3.

Then, the mixture gas plasma G thus formed is flowed into the semiconductor depositing region 4 as in the case of the embodiment of FIG. 1, by which the semiconductor material is deposited on the surface of each substrate 7. In this case, as in the same manner as set forth previously in respect of FIG. 1, the atmospheric pressure in the reaction chamber 1 is held low and the substrates 7 are maintained at a relatively low temperature, whereby non-single-crystalline semiconductor layers are formed on the substrates 7. In this case, however, by the orientating-accelerating DC electric field set up by the orientating-accelerating DC power source 32 in a direction perpendicular to the surface of each substrate 7, the mixture gas plasma in the semiconductor depositing region 4 is oriented towards the substrate 7 to orientate and accelerate thereto semiconductor ions, thus promoting the deposition of the semiconductor material on the substrate 7.

The embodiment illustrated by FIG. 2 is similar to the embodiment illustrated by FIG. 1 except in that the mixture gas plasma in the semiconductor depositing region 4 of the reaction chamber 1 is orientated and accelerated by the DC electromagnetic field to orientate and accelerate the semiconductor material ions towards the substrate 7, thereby promoting the deposition thereon of the semiconductor.

Accordingly, the embodiment illustrated by FIG. 2 has the same excellent features as those obtainable with the embodiment illustrated by FIG. 1 and the advantage that the non-single-crystalline semiconductor layer on the substrate 7 can be formed with higher density by the orientation and acceleration of the mixture gas plasma towards the substrate 7 by the DC electric field. In this case, however, the DC electric field must be selected to a suitable intensity, for example, 100 to 1000 V in terms of the voltage available from the DC power source 32.

Figure 3:
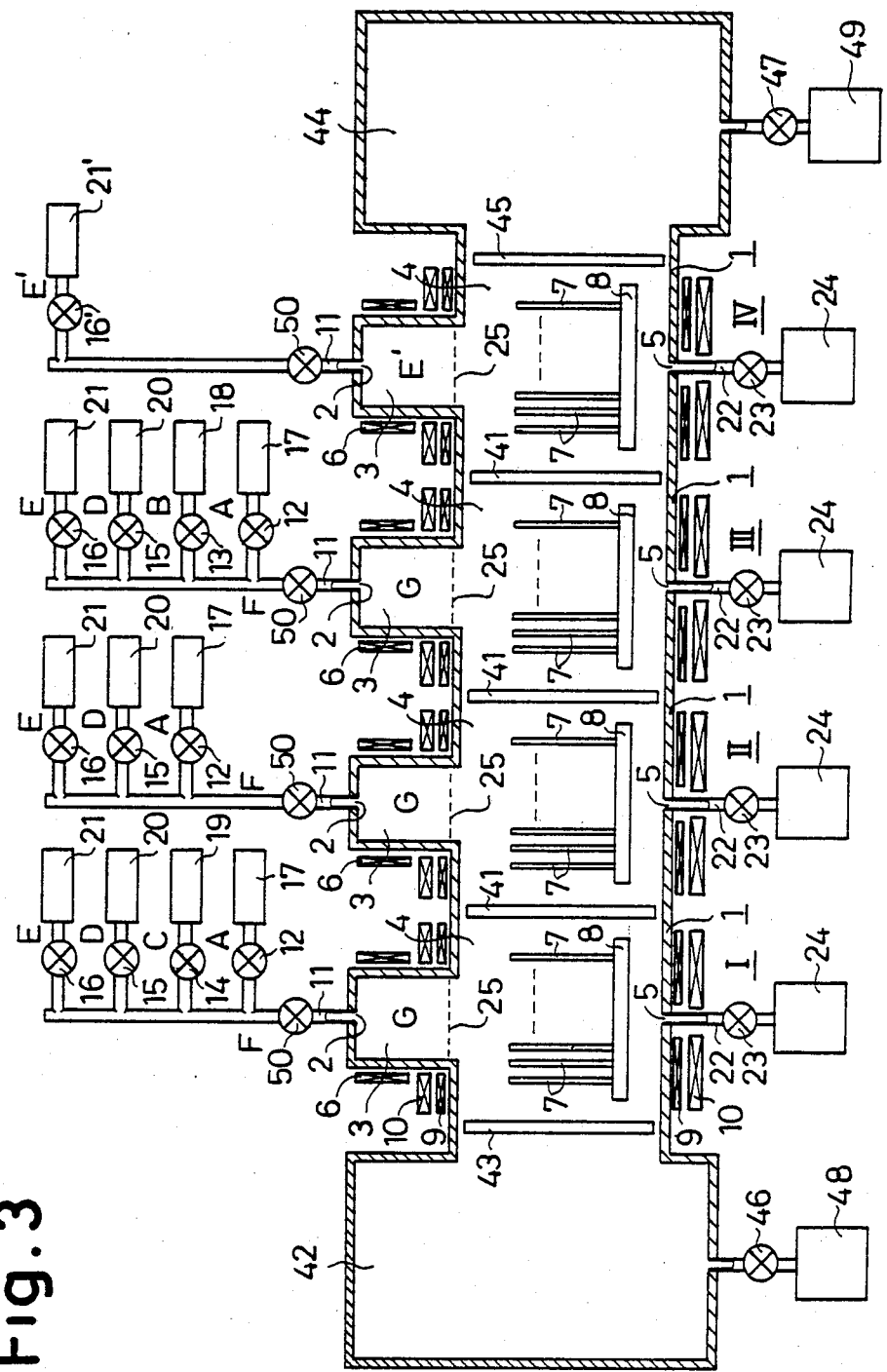
FIG. 3 is a schematic diagram showing still another embodiment of the present invention and an example of the arrangement therefor.

Next, a description will be given, with reference to FIG. 3, of still another embodiment, in which a P type non-single-crystalline semiconductor layer, an I type (intrinsic) non-single-crystalline semiconductor layer and an N type non-single-crystalline semiconductor layer are sequentially formed on each substrate in this order. In FIG. 3, parts corresponding to those in FIG. 1 are marked with the same reference numerals and no detailed descripiton will be repeated. In the apparatus of FIG. 3, four reaction chamber 1, each identical in construction with the reaction chamber 1 described previously in conjunction with FIG. 1, are formed as a unitary structure with one another in such a manner that the semiconductor depositing regions 4 of adjacent ones of the reaction chamber 1 intercommunicate, with a shutter 41 interposed therebetween and the reaction chambers respectively form reaction parts I, II, III and IV.

In this case, the gas sources for the reaction part I do not include the N type impurity compound gas source 18 in the embodiment of FIG. 1; the gas sourbes for the reaction part II do not include the N type impurity compound gas source 18 and the P type impurity compound gas source 19 in the embodiment of FIG. 1; and the gas sources for the reaction part III do not include the P type impurity compound gas source in the embodiment of FIG. 1. The gas source for the reaction part IV is only the carrier gas source 21 from which is available a carrier gas E' consisting of one or more of helium, neon and hydrogen gases. Each mixture gas supply pipe 11 has a control valve 50 on the side of the reaction part. The reaction part I communicates, on the opposite side from the reaction part II, with a chamber 42, with a shutter 43 interposed therebetween. The chamber 42 is provided for inserting into the semiconductor depositing region 4 of the reaction part I the boat 8 having planted thereon the substrates 7 to be deposited with non-single-crystalline semiconductor layers. The reaction part IV communicates, on the opposite side from the reaction part III, with a chamber 44, with a shutter 45 interposed therebetween. The chamber 44 is provided for taking out from the semiconductor depositing region 4 the boat 8 having planted thereon the substrates 7 deposited with the noncrystalline semiconductor layers. The chambers 42 and 44 have connected thereto respectively via control valves 46 and 47 exhausters 48 and 49 similar to the aforesaid one 24.

The boat 8 having planted thereon the substrates 7, which is placed beforehand in the chamber 42 evacuated by the exhauster 24, is inserted into the semiconductor depositing region 4 of the reaction part I, opening the shutter 43. The insertion of the boat 8 is carried out in such a state in which the reaction part I is entirely evacuated or only the carrier gas E flows into the reaction part I. Then, in the semiconductor depositing region 4 a P type, non-single crystalline semiconductor layer is deposited on each substrate 7 in the same manner as described previously with regard to FIG. 1.

Thereafter, the boat 8 carrying the substrates 7 respectively deposited with the P type, non-single-crystalline semiconductor layers is inserted into the semiconductor depositing region 4 of the reaction part II, with the shutter 41 opened. This insertion of the boat 8 is carried out in such a state in which the reaction parts I and II are entirely evacuated or only the carrier gas E flows therein. In the semiconductor depositing region 4 an I type non-single-crystalline semiconductor layer is formed on the P type, non-single-crystalline semiconductor layer of each substrate 7 in the same manner as described previously in respect of FIG. 1.

Following this, the boat 8 carrying the substrates 7, each having formed thereon the P type, non-single-crystalline semiconductor layer and the I-type, non-single-crystalline semiconductor layer in this order, is inserted from the reaction part II into the semiconductor depositing region 4 of the reaction part III, with the shutter 41 opened. Also in this case, the boat 8 is inserted into the reaction part III in such a state in which the reaction parts II and III are entirely evacuated or only the carrier gas E flows therein. In the semiconductor depositing region 4 of the reaction part III an N type, non-single-crystalline semiconductor layer is deposited on the I type, non-single-crystalline semiconductor layer of each substrate 7 in the same manner as described previously with reference to FIG. 1.

Then, the boat 8 which carries the substrates 7, each having formed thereon the P type, I type and N type, non-single-crystalline semiconductor layers in this order, is inserted from the reaction part III into the semiconductor depositing region 4 of the reaction part IV, with the shutter 41 opened. In this case, the boat 8 is inserted into the reaction part IV in such a state in which the reaction parts III and IV are entirely evacuated or only the carrier gases E' are passed thereinto. In the semiconductor depositing region 4 of the reaction part IV the P, I and N type, non-single-crystalline semiconductor layers formed on each substrate 7 are annealed by a carrier gas plasma into which the carrier gas E' is ionized in the gas ionizing region 3.

Thereafter, the boat 8 carrying the substrates, each deposited with the P, I and N type, non-single-crystalline layers, is inserted into the chamber 44 from the reaction part IV, with the shutter 45 opened. In this case, the reaction part IV is entirely evacuated or only the carrier gas E' is passed thereinto.

Then, the substrates having thus deposited thereon the P, I and N type, non-single-crystalline semiconductor layers are taken out from the chamber 44.

It will be apparent that many modifications and variations may be effected without departing from the scope of the novel concepts of this invention.

What is claimed is:

1. A multi-layer semiconductor manufacturing method which employs a plurality n of sequentially arranged, adjacent reaction chambers $C_1, C_2 \ldots C_n$, a plurality $(n-1)$ of normally closed shutter means $G_{12}, G_{23} \ldots G_{(n-1)n}$ separating the reaction chamber $C_1$ and $C_2$, $C_2$ and $C_3 \ldots C_{(n-1)}$ and $C_n$, respectively, an inserting chamber $C_0$ adjacent the reaction chamber $C_1$ and separated therefrom by a shutter means $G_{01}$ and a taking-out chamber $C_{n+1}$ adjacent the reaction chamber $C_n$ and separated therefrom by a shutter means $G_{n(n+1)}$, the reaction chambers $C_1$ to $C_n$ being each provided with a gas inlet and a gas outlet, the inserting chamber $C_0$ and the taking-out chamber $C_{n+1}$ being each provided with another gas outlet, the inserting chamber $C_0$ and the reaction chamber $C_1, C_2 \ldots C_n$ having positioned therein $(n+1)$ substrates $B_{n+1}, B_n \ldots B_2, B_1$ respectively, the method comprising the steps of:

depositing n semiconductors on the substrates $B_n, B_{n-1} \ldots B_1$ to form thereon n semiconductor layers $L_1, L_2 \ldots L_n$, respectively, by introducing at least n semiconductor compound gases into the reaction chambers $C_1, C_2 \ldots C_n$ through the gas inlets thereof in such a state that gases in the reaction chambers $C_1, C_2 \ldots C_n$ are exhausted therefrom through the gas outlets thereof and by applying n ionizing electromagnetic fields to the semiconductor compound gases to ionize them into semiconductor compound gas plasmas while at the same time passing semiconductor gas plasmas into the reaction chambers $C_1, C_2 \ldots C_n$ by discharging therefrom the gases, respectively;

displacing the shutter means $G_{01}, G_{12}, G_{23} \ldots G_{(n-1)n}, G_{n(n+1)}$ and moving the substrates $B_{n+1}, B_n \ldots B_2, B_1$ from the inserting chamber $C_0$ and the reaction chambers $C_1, C_2 \ldots C_n$ to the reaction chambers $C_1, C_2 \ldots C_n$ and taking out chamber $C_{n+1}$, respectively, while at the same time evacuating entirely the inserting chamber $C_0$, the reaction chamber $C_1$ to $C_n$ and the taking-out chamber $C_{n+1}$ or passing therethrough only carrier gases and then closing the shutter means $G_{01}, G_{12} \ldots G_{n(n+1)}$; and positioning a substrate $B_{n+2}$ in the inserting chamber $C_0$ while at the same time taking out the substrate $B_1$ from the taking-out chamber $C_{n+1}$, whereby to fabricate the multi-layer semiconductor having the n semiconductor layers $L_1, L_2 \ldots L_n$ sequentially laminated in this order.

2. A multi-layer, non-single-crystal semiconductor manufacturing method according to claim 1, wherein the semiconductors each include hydrogen or a halgon, and the semiconductor layers are non-single-crystalline.

3. A multi-layer, non-single-crystal semiconductor manufacturing method according to claim 2, wherein one or more of the semiconductor layers are non-single-crystal silicon layers.

4. A multi-layer, non-single-crystal semiconductor manufacturing method according to claim 2, wherein one or more of the semiconductor layers non-single-crystal silicon compound layers.

5. A multi-layer, non-single-crystal semiconductor manufacturing method according to claim 2, wherein one or more of the semiconductor layers are N conductivity type non-single-crystal semiconductor layers and the other remaining semiconductor layers are P conductivity type non-single-crystal semiconductor layers.

6. A multi-layer, non-single-crystal semiconductor manufacturing method according to claim 2, wherein one or more of the semiconductor layers are N conductivity type non-single-crystal semiconductor layers, one or more of the other semiconductor layers are P conductivity type non-single-crystal semiconductor layers and the remaining semiconductor layers are I conductivity type non-single-crystal semiconductor layers.

* * * * *